United States Patent [19]

Pryor

[11] 4,171,989

[45] Oct. 23, 1979

[54] CONTACT FOR SOLAR CELLS

[75] Inventor: Robert A. Pryor, Phoenix, Ariz.

[73] Assignee: Motorola, Inc., Schaumburg, Ill.

[21] Appl. No.: 874,715

[22] Filed: Feb. 2, 1978

Related U.S. Application Data

[63] Continuation of Ser. No. 652,922, Jan. 27, 1976, abandoned.

[51] Int. Cl.² ............................................. H01L 31/06
[52] U.S. Cl. ................................................. 136/89 CC
[58] Field of Search ............ 136/89 CC, 89 P, 89 PC; 357/30, 68

[56] References Cited

U.S. PATENT DOCUMENTS

| 3,502,507 | 3/1970 | Mann | 136/89 |
|---|---|---|---|
| 3,589,946 | 6/1971 | Tarneja et al. | 136/89 |
| 3,811,954 | 5/1974 | Lindmayer | 136/89 |
| 3,966,499 | 6/1976 | Yasui | 136/89 X |

Primary Examiner—Aaron Weisstuch
Attorney, Agent, or Firm—Lowell E. Clark

[57] ABSTRACT

An improved solar energy device has a body of semiconductor material of a first conductivity type with a region of a second conductivity type formed in the body and extending to its surface. A current collection metallization pattern is disposed on the second conductivity type region, with at least three distinct and identifiable current accumulation points connected to the metallization pattern adjacent to the periphery of the second conductivity type region. External electrical connection is made to extract available electrical power from the device at the current accumulation points. The periphery of the device is free of other electrically equivalent external electrical connection areas. These features allow a substantial increase in device efficiency.

7 Claims, 6 Drawing Figures

CONTACT FOR SOLAR CELLS

CROSS REFERENCE TO RELATED APPLICATIONS

This is a continuation of application Ser. No. 652,922, filed Jan. 27, 1976, now abandoned.

This invention is related to semiconductor solar energy devices of the general type disclosed and claimed in commonly assigned, copending application Ser. No. 645,572, now U.S. Pat. No. 4,070,689 entitled "SEMICONDUCTOR SOLAR ENERGY DEVICE AND FABRICATION METHOD THEREFOR," filed in the names of Michael G. Coleman and Fabio Restrepo on Dec. 31, 1975, and copending application Ser. No. 645,600, now abandoned, bearing the same title and filing date and filed in the names of Israel A. Lesk and Robert A. Pryor. A divisional application of said Lesk and Pryor application has issued as U.S. Pat. No. 4,131,488. More particularly, the present invention relates to improvements in the structure of such devices and methods for making them which allow a substantial increase in power output of such devices without adding significantly to the cost of producing them.

DESCRIPTION OF THE PRIOR ART

Semiconductor solar energy devices of the general type disclosed in the above referenced two applications are known in the art. In such devices, a region of a second conductivity type is formed in a semiconductor substrate of a first conductivity type and extends to the surface of the substrate. Light impinges on the device and creates electron-hole pairs in the substrate. In the case of a P-type substrate and an N-type region extending to its surface, the electrons migrate toward the N-type region and create a current across the P-N junction. A metallization pattern is provided on the surface of the region for the purpose of collecting the generated current, thus producing usable electrical energy.

Some experimental work has also been done with semiconductor solar energy devices in which no region of opposite conductivity type to the semiconductor substrate is provided. In such a device, the current collection metallization pattern forms a Schottky barrier with the semiconductor substrate.

In both types of devices, typical current collection metallization patterns consist of a series of metallization fingers extending outward from a common buss at right angles to it. Such a metallization pattern works reasonably well for devices of small area, especially those having a rectangular shape, such as solar cells used in space satellite applications. However, a noticeable lack of efficiency may be observed with such patterns, especially when they are employed for larger area devices.

In the past, cost considerations have not been a primary concern in solar energy devices. They have found principal application in specialized circumstances where other electrical generating facilities are not available or are impracticable, such as in satellites for use in outer space or equipment intended for remote terrestrial locations. Solar energy devices are now receiving consideration as a means of primary electricity generation for terrestrial applications. To be a viable alternative for either fossil fuel or nuclear generation of electrical energy, substantial cost reduction in the fabrication of semiconductor solar energy devices is required. The ability to increase solar energy device size without substantial efficiency losses is an important component of cost reduction efforts now under way to make such solar energy devices a viable alternative for generation of large amounts of electrical energy.

SUMMARY OF THE INVENTION

Accordingly, it is an object of this invention to increase the size of solar energy devices without decreasing the efficiency of current collection from them.

It is another object of the invention to provide a semiconductor solar cell design having a current collection metallization pattern which maximizes current flow output from the design.

It is a further object of the invention to provide a reliable process for large scale manufacture of semiconductor solar energy devices at a significantly lower cost than processes heretofore employed, while maintaining or even increasing efficiency.

The attainment of these and related objects may be achieved through use of the novel solar energy device design and process herein disclosed. Such a device in accordance with this invention includes a body of semiconductor material of a first conductivity type having a surface and a means for producing a current from photo generated minority carriers. In one form of the invention, a current collection metallization pattern having a specified metallization area is disposed on the body of semiconductor material to form a current flow path, together with the body semiconductor material, for electrical current generated in the body of semiconductor material to at least three distinct and identifiable current accumulation points connected to the metallization pattern adjacent to the periphery of the device. The devices of FIGS. 1 and 4, for example, each show four current accumulation points, while the devices of FIGS. 5 and 6 show eight and ten current accumulation points; the latter figures also indicate the generalization of the concept by the showing of the possible linear extension of the device to embrace additional contact points not explicitly shown but implied by the broken metallization pattern at the lateral ends of the figures. As shown by FIGS. 1, 4, 5 and 6, the current accumulation points are desirably configured other than collinearly, that is, at least one of the current accumulation points does not lie on a same straight line defined by two or more other accumulation points. External electrical connection to the device is made at the current accumulation points. The metallization pattern and current accumulation points are configured such that the periphery of the device is free of other electrically equivalent external electrical connection areas. The current collection metallization pattern may form a substantial part of an internal voltage drop associated with this current flow. The current collection metallization pattern is preferably configured such that the voltage drop between any element of active current generating area on the body of semiconductor material and its current accumulation point is substantially uniform, when compared to the voltage drop between any other elemental area on the body of semiconductor material and its current accumulation point. As used herein, an "elemental area" on the body of the semiconductor material comprises an area adjacent to and supplying current to a segment of a current collection line of the metallization pattern. As used herein, the "substantially uniform voltage drop" means that the average voltage drop in the lowest voltage drop elemental area of the device varies from the average voltage drop in the highest voltage drop elemental area by no more than about 50 percent. With use of the novel metallization pattern topography in accordance with this invention, which is chosen to make the most efficient use of the total specified metallization area and designed to provide such a substantially uniform voltage drop, the internal voltage drop averaged over the total area of the solar energy device can be reduced below that of prior art devices, even if no special pains are taken to provide the lowest resistance current collection metallization material. These design features allow output efficiency of the solar energy device to be maintained at acceptable levels even with low cost, higher resistance current collection metallization patterns. In particular, the current collection metallization pattern may be formed by electroless plating, a rapid, low cost method for depositing a nickel or other metal pattern on the devices.

Of course, the total output current of a semiconductor solar device is proportional to its area. The metallization pattern of a larger area device must collect more current that the pattern of a smaller area device. Because of this, the total internal voltage drop of the device will be larger in magnitude for a larger device, given the constraints of using the same metallization material with the same percent coverage of the device surface area. Using the design features outlined above, the total internal voltage drop for a 2 inch circular semiconductor solar device can be made at least as small as 30 millivolts for a cell operating at a current output level of 700 milliamperes. Larger area devices will have larger total internal voltage drops, e.g., a 3 diameter cell can be designed to have a total internal voltage drop of less than 50 millivolts. On the other hand, smaller cells, such as 2 centimeter×4 centimeter space cells, can be made with much smaller internal voltage drops, e.g., 10 to 15 millivolts.

In its preferred form, a solar energy device in accordance with the invention has a region of a second conductivity type in the semiconductor body of first conductivity type and extending to its surface. Such a region provides a more efficient means for producing a current from minority carriers generated in the semiconductor body and in the second conductivity type region. The current collection metallization pattern is then disposed on the second conductivity type region to complete the device. Alternatively, the means for producing a current from minority carries photo induced in the semiconductor body may comprise a Schottky barrier layer formed between the current collection metallization and the semiconductor body.

While the preferred semiconductor material for use in this invention is silicon due to its abundance and relatively low cost, germanium, or compound semiconductors, such as gallium aresenide, cadmium sulfide, and the like may be used as well.

The attainment of the foregoing and related objects, advantages and features of the invention should be readily apparent after review of the following more detailed description of the invention, taken with the drawings, in which:

DETAILED DESCRIPTION OF THE INVENTION

Figure 1:
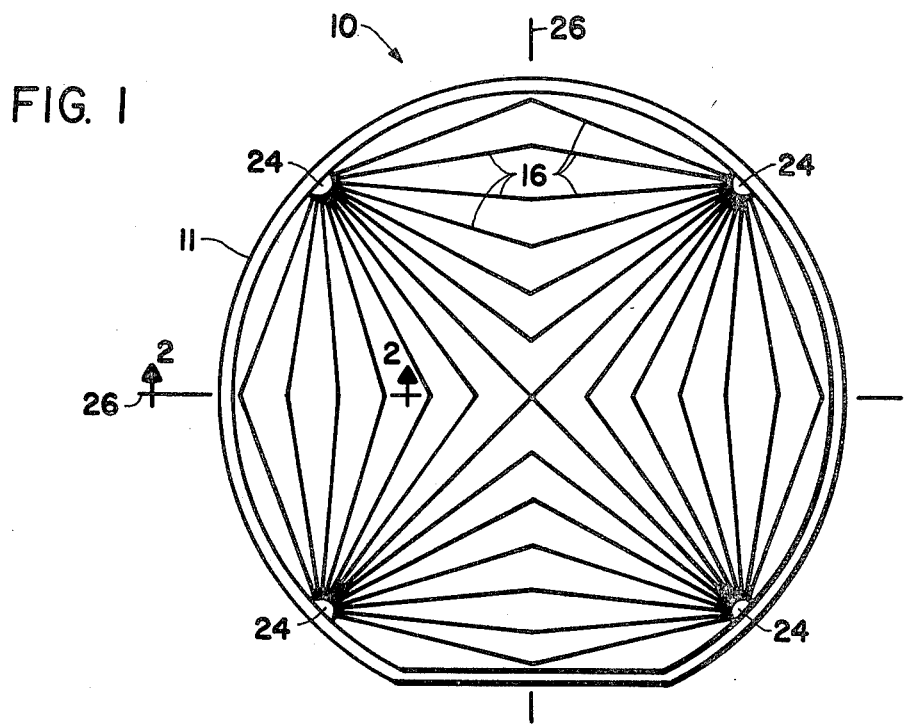
FIG. 1 is a plan view of a solar energy device in accordance with the invention.
Figure 2:
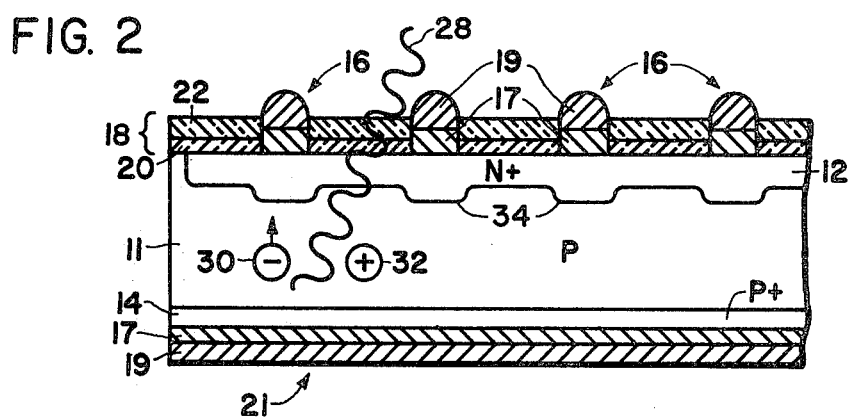
FIG. 2 is a partial cross section of the device shown in FIG. 1, taken along the line 2-2'.

Turning now to the drawings, more particularly to FIGS. 1 and 2, a solar energy device 10 representing one form of the invention is shown. There is shown a P-type semiconductor substrate 11 having an N+ region 12 formed in its upper surface. P+ region 14 is formed on the lower surface of substrate 11, but may be omitted if desired. Current collection metallization lines 16 are disposed on the surface of N+ region 12, and consist of a layer 17 of electrolessly deposited nickel and a coating 19 eutectic lead-tin solder. Electrolessly deposited nickel layer 17 and solder coating 19 on the backside of substrate 11 comprise a backside contact 21 for the device and is conveniently formed at the same time as the current collector metallization lines 16. The solder coating 19 helps to provide a sufficient volume of metal in the metallization lines for good current flow. Dielectric anti-reflective coating 18 consisting of silicon dioxide layer 20 and silicon nitride layer 22, is provided on the upper surface of the device and also serves to separate the current collection lines 16 from each other. The current collection lines 16 are each connected to a current accumulation point 24 on the upper surface. These current accumulation points 24 serve as the locations of external electrical connections to the solar energy device.

It should be noted that the pattern of metal interconnection lines 16 as shown in FIG. 1 eliminates the use of buss bars in the current collection metallization completely, i.e., each of the current collection lines 16 is electrically connected in parallel with other current collection lines 16 connected to a particular current accumulation point 24. This type of pattern will provide the most efficient use of metal contact area placed on the active front surface of the solar energy device. Such metallization patterns generally cover from about 5 to about 15% of the surface area of the solar energy device.

In order to produce a substantially uniform voltage drop between any elemental area in the N+ region 12 and the current accumulation point 24 to which its current collection line 16 is connected, the spacing and number of lines is varied across the surface of the device. If necessary, individual line widths are also varied. For the type of design shown in FIG. 1, the spacing of the current collection lines 16 is much closer near the current supply points 24, since a higher current flow occurs near these points. With the design of FIG. 1, the solar energy device is divided into four quadrants as shown by lines 26. It should be noted that essentially all of the current generated in each quadrant is summed at the current accumulation point 24 located in each quadrant. Further, the presence of multiple current accumulation points in the device in effect provides some design redundancy in that most of the output current from the cell can continue to be obtained even if an external electrical connection to one of the current accumulation points 24 should come loose.

In practice, the P substrate 11 desirably has a resistivity between about 0.1 and 20 ohm centimeters, with a resistivity of about 1 ohm centimeter being preferred. The substrate 11 is from about 4 mils to about 25 mils in thickness. N+ region 12 desirably has a thickness of about 0.1 and 0.5 microns, with thickness of about 0.2 microns being preferred. It typically has a surface concentration of about $10^{20}$ dopant atoms per cubic centimeter, which concentration decreases monotonically away from the upper surface of the region. P+ region 14 desirably has a thickness of between about 0.5 and 1.0 microns and a surface concentration of between about $10^{18}$ and $10^{21}$ atoms per cubic centimeter.

In operation, light 28 from the sun enters the solar energy device at its upper surface. The light creates an electron 30-hole 32 pair in P-type substrate 11. The electron 30 migrates to the junction between N+ region 12 and P-type substrate 11, where it is collected. Electrons 30 produce the electrical current generated by the device, that current is collected by the collection metallization lines 16, and it is supplied to the current accumulation points 24 of the device.

It should be apparent that the device of FIGS. 1 and 2 could be made starting with an N-type substrate, in which case the conductivity type of each region shown would be opposite. In such a case, holes rather than electrons would be collected to form the primary contribution to the output current of the device. However, the minority carrier lifetime of electrons in P-type semiconductor material is longer than the minority carrier lifetime of holes in N-type semiconductor material. For this reason, solar cells made with a P-type substrate usually have a higher efficiency than those with an N-type substrate.

The device shown in FIGS. 1 and 2 can be made with the general process sequence described in detail in the above referenced Coleman and Restrepo patent, the disclosure of which is hereby incorporated by reference herein. Briefly, silicon dioxide layer 20 is formed on P-type semiconductor substrate 11, desirably by thermal oxidation or chemical vapor deposition. Silicon nitride layer 22 is then formed on top of the silicon dioxide layer to complete the anti-reflective coating 18. Openings are formed in the anti-reflective layer corresponding to the pattern of current collection lines 16 as shown in FIG. 1. An ion implantation is then carried out using a suitable N-type dopant through the anti-reflective coating and into the openings formed in it. Thicker portions 34 of N+ region 12 formed thereby result from the fact that the ions implanted through the openings do not have to pass through the anti-reflective coating 18. P+ layer 14 is then formed by ion implantation from the backside of substrate 10. Current collection lines 16 are then plated in the openings formed in anti-reflective coating 18, desirably by electroless plating. The current collection points 24 may simply be a concentrated portion of the metallization lines, or they may be formed by a separate process step. To complete fabrication of the device, the entire device 10 is immersed in molten eutectic lead-tin solder. The solder adheres only to the elctroless nickel deposits 17, thus forming a layer 19 of solder wherever the electroless nickel is deposited, but not on other areas of the device 10.

Figure 3:
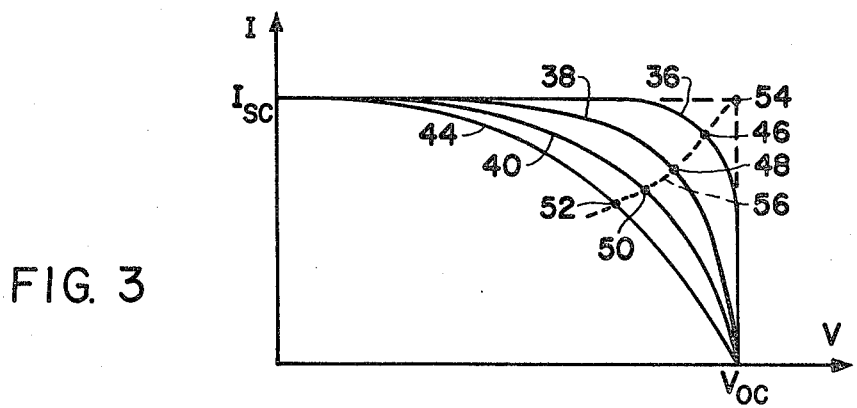
FIG. 3 is an idealized current-voltage plot for solar energy devices.

Turning now to FIG. 3 of the drawings, there is shown a series of idealized current voltage curves for solar energy devices, useful for understanding the advantage obtained through use of the present invention. As shown in FIG. 3, the abscissa represents voltage and the ordinate represents current. The point on the abscissa designated Voc represents the open circuit voltage of a solar energy device, which is ,ypically between about 0.4 and 0.8 volts for a silicon solar cell. The point designated Isc on the ordinate represents the short circuit current of the solar energy device, typically between 20 and 50 milliamperes per square centimeter. The curves 36–44 represent operating curves for a series of solar energy devices, with the curve 36 representing a device of highest efficiency and the curve 44 representing a device of lowest efficiency. The area under each of these curves at a particular operating point for the devices represents the power output of the devices at that operating point. Obviously, the solar cells should be operated under those conditions which will produce a maximum power output, i.e., the largest rectangular area under their respective curves. Points 46–52 illustrate the maximum power output points for the curves 36–44, respectively. These points, taken together with point 54, representing the product of Isc and Voc define a curve indicated by the dotted line 56 for the solar cells whose operating characteristics are graphed in FIG. 3. It should be noted that, when an average internal voltage drop for a solar energy device having a given area is specified, the larger the average voltage drop, the further down and to the left on curve 56 would be the maximum power output operating point for that solar cell. Average internal voltage drop therefore represents a significant parameter in the characterization of a solar energy device of a particular area.

Figure 4:
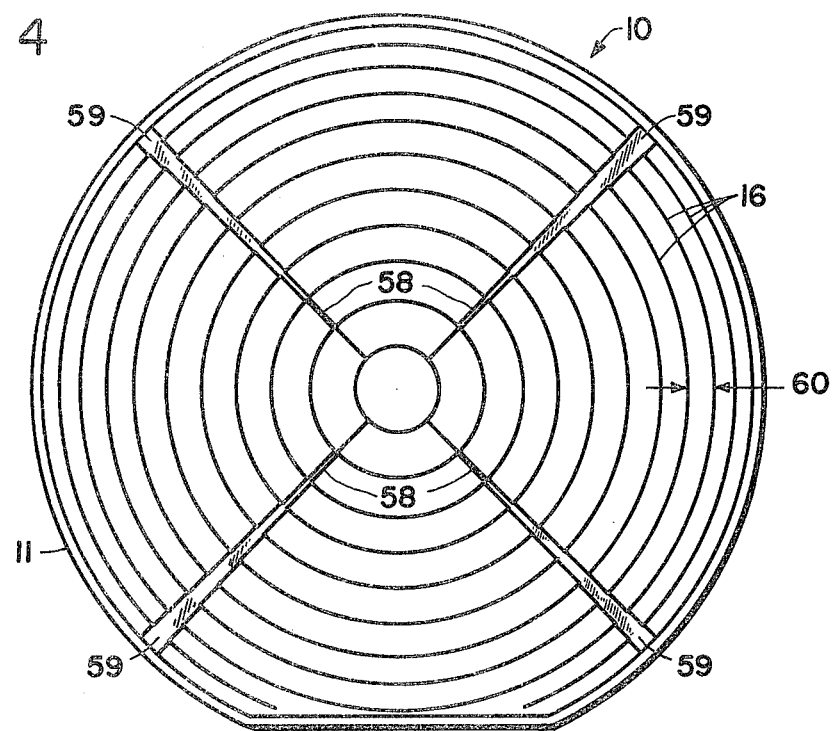
FIG. 4 is a plan view of another embodiment of the invention.

FIG. 4 shows another embodiment of a metallization pattern that will provide a substantially uniform voltage drop for the solar energy device 10. Essentially, the pattern consists of a plurality of current collection lines 16, arranged as a series of concentric circles. The concentric circles are divided into four quadrants by buss bars 58, which increase in width along their length running from the center of the device 10 outwardly towards its edges. This is because the amount of current carried by the buss bars 58 increases near the edge of the device 10. Ends 59 of the buss bars 58 serve as current accumulation points for the device, to which external connection is made. Since most of the power is generated in the outer portions of the solar energy device 10, spacing 60 between adjacent current collection lines 16 decreases toward the outer edge of the device 10. Similarly, the line widths of current collection lines 16 may also be increased near the edge of the device as well.

In a specific example, silicon solar devices are fabricated in two inch diameter 1.2 ohm centimeter P-type monocrystalline semiconductor wafers having an N+ ion implanted region with a surface concentration of $2 \times 10^{20}$ atoms per cubic centimeter, decreasing monotonically into the silicon wafer to a depth of 0.2 microns and a P+ ion implantation into the back surface of the wafer with a surface concentration of $5 \times 10^{20}$ atoms per cubic centimeter, decreasing monotonically to a depth of 0.6 microns. The overall substrate thickness is 2.1 mils. A metallization pattern of the type shown in FIG. 4 is deposited as electroless nickel coated with eutectic lead-tin solder on the surface of the N+ current collection region, through openings etched in a silicon dioxide-silicon nitride anti-reflective coating, with the current collection lines 16 and bus bars 58 covering about 7% of the solar cell surface area.

To achieve substantially uniform voltage drops over the device, the outer metal ring widths are from 3.5 to 5.0 mils and are spaced more closely than the inner metal rings, which have a width of 3.0 mils. The buss bars 58 increase in width in stepwise manner from 4 mils at the center of the device to 56 mils at its outer edge.

In operation, this solar cell exhibited an average internal voltage loss of 18 millivolts, when operated at a maximum power point of 0.45 volts and 500 milliamperes. In comparison, a commercially available 2×4 cm$^2$ NASA space qualified silicon solar cell having a metallization pattern consisting of fingers extending perpendicular to a central buss bar may have a typical internal voltage of about 50 millivolts at its maximum power point. The commercially available cell utilizes a low resistance titanium-silver metallization pattern and has an area 2.5 times smaller than the specific example of the invention discussed above. It should be noted that the improved performance obtainable with the present invention is achieved even with use of relatively poorly conducting lead-tin solder as the primary metal of the current collection metallization pattern.

Figure 5:
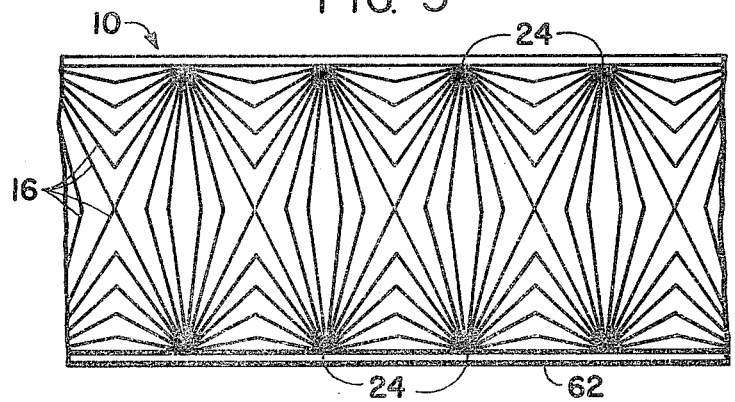
FIG. 5 is a plan view of yet another embodiment of the invention.
Figure 6:
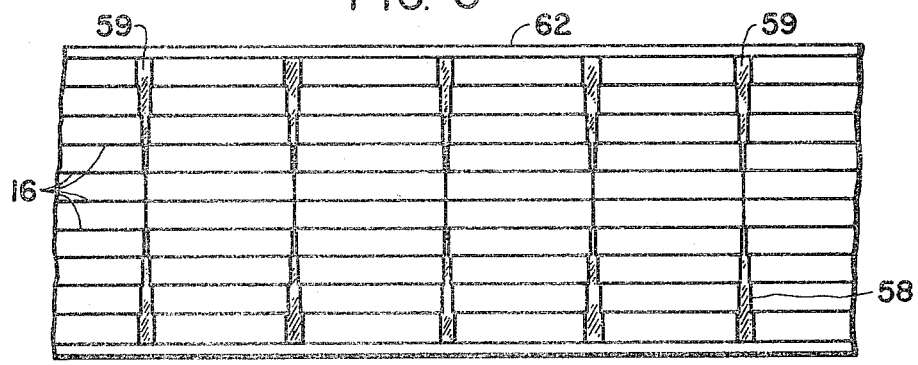
FIG. 6 is a plan view of still another embodiment of the invention.

FIGS. 5 and 6 show how the current collection metallization patterns of FIGS. 1 and 4, respectively, may be modified for use with a silicon ribbon, rather than an essentially circular semiconductor wafer, as shown in FIGS. 1 and 4. As shown in FIG. 5, the current collection metallization lines 16 run between adjacent and oppositely spaced current accumulation points 24. As in the case of the metallization pattern in FIG. 1, each of the current collection metallization lines 16 in effect acts as its own buss bar and each current collection line 16 is routed to a current accumulation point 24, at which external electrical contact to the device 10 is made.

In FIG. 6, the current collection metallization lines 16 run parallel to the length of ribbon 62. As in FIG. 4, the buss bars 58 increase in width in a stepwise manner away from the center of silicon ribbon 62. As in FIG. 4, external electrical connection to the solar cell 10 is made at points 59, representing the end of buss bars 58. The current collection lines 16 may be equally spaced lines with different line widths, equal line widths with different spacing, or a combination of the two, in order to obtain a substantially uniform voltage drop across the solar cell 10.

It should be apparent that further modification may be made to the current collection metallization patterns shown. For example, with circular shaped solar energy cells, such as shown in FIGS. 1 and 4, six or more current supply points 24 and 59, rather than the four shown, may be provided for each device for the purpose of allowing a higher packing density of such circular devices in an array or for the purpose of achieving a further reduction of internal voltage losses. Similarly, the metallization patterns may be formed by a blanket deposition and subtractive etch process, if no anti-reflective coating on the surface of the solar cells is desired, or if it is desired to form the anti-reflective coating after deposition of the current collection metallization.

It should now be apparent that a solar energy device and process capable of achieving the stated objects of the invention has been provided. By designing the topography of the metallization pattern in accordance with this invention, based on the geometry and total area of the solar energy device, the internal voltage drop averaged over the total device area is minimized. This allows the size of solar energy devices to be increased without paying a substantial penalty in current collection efficiency. It also means that low cost, high volume techniques can be employed to form the current collection metallization, rather than relying on slower, more complex processes which will produce higher conductivity metallization patterns.

Thus, by specifying an acceptable area of metal coverage, by providing a metal pattern which produces substantially uniform voltage drops within the total area of the solar device by providing a multiplicity of current accumulation points near the periphery of the device, and by minimizing the absolute value of the average internal voltage drop of the total solar device, a substantially increased performance is obtained from the solar energy device. In this manner substantial improvement in performance over prior art devices can be obtained even when using a higher resistivity metal material. This means that low cost processes, such as electroless deposition of nickel with subsequent coating with lead-tin solder, may be used to provide the metallization pattern.

While the present invention has been described in its present preferred form, it is intended that various modifications as discussed above, as well as other modifications thereto, be covered within the spirit and scope of the claims appended hereto.

What is claimed is:

1. A semiconductor solar energy device, which comprises:
   (a) a body of semiconductor material having an upper and a lower surface;
   (b) means for producing a current from photogenerated minority carriers in said body of semiconductor material;
   (c) at least three distinct and identifiable current accumulation points for making external electrical connection to the device disposed on the upper surface of said body near the periphery of said cell;
   (d) current collection metallization means comprising a plurality of current collection lines disposed on the upper surface of said body and electrically connected to said current accumulation points, said current collection lines having a closer spacing near said current accumulation points than on the portions of said upper surface inwardly removed from said periphery.

2. The solar energy device of claim 1 where the current collection metallization means further comprises metallic bus bars generally transverse to said current collection lines, and the mutual spacing of said lines along the direction of said bus bars decreases in a predetermined manner towards said current accumulation points.

3. The device of claim 2 where said current collection lines are concentric circles.

4. The device of claim 1 including at least four non-collinear current accumulation points.

5. The device of claim 1 where said metallic current collection lines for collecting photogenerated current collecting lines and connected directly to said current accumulation points.

6. The device of claim 1, where said current collection means comprise buss bars having an increased width on the portions said upper surface proximate said periphery than on the portions of said upper surface inwardly removed from said periphery.

7. The device of claim 1, where said increased width is configured in a stepwise manner.

* * * * *